(12) United States Patent
Xu et al.

(10) Patent No.: US 10,426,050 B1
(45) Date of Patent: Sep. 24, 2019

(54) HOME SECURITY DEVICE ASSEMBLY FOR DIRECT MAIL PACKAGES

(71) Applicant: Roo Inc., New York, NY (US)

(72) Inventors: Jingren Xu, New York, NY (US);
David Sutton, San Francisco, CA (US);
Dhruv Garg, New York, NY (US);
Maximus Yaney, New York, NY (US)

(73) Assignee: Roo Inc., New York, NY (US)

( * ) Notice: Subject to any disclaimer, the term of this patent is extended or adjusted under 35 U.S.C. 154(b) by 0 days.

(21) Appl. No.: 16/160,134

(22) Filed: Oct. 15, 2018

(51) Int. Cl.
  *H05K 1/18* (2006.01)
  *H05K 5/02* (2006.01)
  *H05K 7/14* (2006.01)
  *G08B 13/02* (2006.01)

(52) U.S. Cl.
  CPC ........... *H05K 5/0217* (2013.01); *G08B 13/02* (2013.01); *H05K 1/181* (2013.01); *H05K 7/1427* (2013.01); *H05K 2201/10106* (2013.01); *H05K 2201/10151* (2013.01)

(58) Field of Classification Search
  CPC .... G06F 1/1652; G06F 1/1626; G06F 1/1694; G06F 3/03545; G06F 1/1613; H05K 5/0086; H05K 5/0091; H05K 7/14; H05K 5/0217; H05K 1/181; H05K 7/1427; H05K 2201/10106; H05K 2201/10151; H04M 1/026; H04M 1/0285; H04M 2250/22; H04M 1/0206; G08B 13/02
  See application file for complete search history.

(56) References Cited

U.S. PATENT DOCUMENTS

| | | | | |
|---|---|---|---|---|
| 4,542,442 A * | 9/1985 | Drexler | ..................... | H05K 7/18 361/784 |
| 5,286,928 A * | 2/1994 | Borland | ............... | H04R 1/2819 181/153 |
| 5,674,076 A * | 10/1997 | Billings | .................... | G10H 1/32 381/345 |
| D521,023 S * | 5/2006 | Kim | ........................ | D14/203.7 |
| 7,215,557 B2 * | 5/2007 | Glovatsky | .............. | H05K 1/144 361/748 |
| D642,549 S * | 8/2011 | Zeinoun | ....................... | D14/125 |
| 8,665,236 B2 * | 3/2014 | Myers | .................... | G06F 1/1626 345/173 |
| 8,824,140 B2 * | 9/2014 | Prest | ..................... | G06F 1/1656 361/679.56 |

(Continued)

*Primary Examiner* — Abhishek M Rathod
(74) *Attorney, Agent, or Firm* — Kolisch Hartwell, P.C.

(57) ABSTRACT

The present disclosure provides a home security device assembly for mailing by direct mail package. The home security device assembly includes a first panel. The first panel is characterized by rectangular shape. The first panel includes a ledge extending from a first side of the first panel. The first panel includes a hollow circular tapered intrusion. The home security device assembly includes a second panel. The second panel is characterized by rectangular shape. Dimensions of rectangular shape of the second panel are identical to corresponding dimensions of rectangular shape of the first panel. The second panel includes a continuous ledge extending from three sides of the second panel. The home security device assembly includes an electrical components sub-assembly. The substantially cuboidal housing encapsulates a first section of the electrical component sub-assembly. The electrical component sub-assembly includes at least one sensor.

18 Claims, 5 Drawing Sheets

(56) References Cited

U.S. PATENT DOCUMENTS

| | | | | |
|---|---|---|---|---|
| 9,204,082 B2* | 12/2015 | Gysin | | H04N 5/64 |
| 9,364,861 B2* | 6/2016 | Lasarov | | B05D 7/22 |
| 9,706,025 B2* | 7/2017 | Ikeda | | H04M 1/0285 |
| 9,934,706 B2* | 4/2018 | Lim | | G09F 9/00 |
| 2001/0010493 A1* | 8/2001 | Script | | G08B 13/08 |
| | | | | 340/546 |
| 2006/0268528 A1* | 11/2006 | Zadesky | | H04M 1/0202 |
| | | | | 361/728 |
| 2009/0059485 A1* | 3/2009 | Lynch | | H01H 9/0207 |
| | | | | 361/679.01 |
| 2011/0019100 A1* | 1/2011 | Lo | | H05K 5/0017 |
| | | | | 348/725 |
| 2011/0267316 A1* | 11/2011 | Kim | | G06F 1/1639 |
| | | | | 345/175 |
| 2011/0305875 A1* | 12/2011 | Sanford | | H05K 5/0013 |
| | | | | 428/174 |
| 2012/0019482 A1* | 1/2012 | Wang | | G06F 1/1652 |
| | | | | 345/175 |
| 2012/0044635 A1* | 2/2012 | Rothkopf | | G06F 1/1626 |
| | | | | 361/679.54 |
| 2012/0236526 A1* | 9/2012 | Weber | | C03C 21/002 |
| | | | | 361/807 |
| 2013/0328792 A1* | 12/2013 | Myers | | G06F 1/1652 |
| | | | | 345/173 |
| 2015/0169002 A1* | 6/2015 | Kemppinen | | G06F 1/1643 |
| | | | | 361/679.55 |

* cited by examiner

HOME SECURITY DEVICE ASSEMBLY FOR DIRECT MAIL PACKAGES

TECHNICAL FIELD

The present disclosure relates to the field of home security devices. More particularly, the present disclosure relates to a home security device for dispatching by direct mail packages.

INTRODUCTION

Over the last few years, there has been a significant rise in use of home security devices. The home security devices facilitate in remote monitoring of facilities. The home security devices are equipped with a plurality of sensors and various electrical components. The plurality of sensors and electrical components are designed and manufactured separately. The plurality of sensors and electrical components are assembled together to enable the home security devices. The plurality of sensors and electrical components are not designed spaciously and efficiently with respect to one another. The plurality of sensors and electrical components are assembled randomly and asynchronously. The plurality of sensors and electrical components take up a lot of space. As a result, the home security devices are bulky and heavy in weight. The home security devices are designed with no constraints or regulations over physical dimensions, weight and form factor.

In light of the above stated discussion, there is a need for a home security device assembly which is compliant with requirements for direct mail packages.

SUMMARY

In an aspect, the present disclosure provides a home security device assembly for mailing by direct mail package. The home security device assembly includes a first panel. The first panel is characterized by rectangular shape. The first panel includes a ledge extending from a first side of the first panel. Plane of the ledge is orthogonal to plane of the first panel. The first panel includes a hollow circular tapered intrusion. The hollow circular tapered intrusion is characterized by a first circular base and a second circular base. Radius of the first circular base is greater than radius of the second circular base. The first circular base is coplanar with plane of the first panel. The first circular base is at least in a single point contact with each of, a second side of the first panel, a third side of the first panel and a fourth side of the first panel. The second circular base is offset from plane of the first panel. Direction of intrusion of the hollow circular tapered intrusion and direction of extension of plane of the ledge are identical and parallel. The home security device assembly includes a second panel. The second panel is characterized by rectangular shape. Dimensions of rectangular shape of the second panel are identical to corresponding dimensions of rectangular shape of the first panel. The second panel includes a first side, a second side, a third side, and a fourth side. The second panel includes a continuous ledge extending from three sides of the second panel. The three sides of the second panel are the second side, the third side and the fourth side. The continuous ledge includes a first extended section, a second extended section and a third extended section. Plane of each extended section of the continuous ledge is orthogonal to plane of the second panel. The first panel and the second panel snap fittingly engage to enable a substantially cuboidal housing for the home security device assembly. The home security device assembly includes an electrical components sub-assembly. The substantially cuboidal housing encapsulates a first section of the electrical component sub-assembly. The electrical component sub-assembly includes a printed circuit board. Plane of the printed circuit board is parallel to plane of the first panel and the second panel. The printed circuit board includes a first side, a second side, a third side and a fourth side. Longitudinal dimension of a second side of the printed circuit board is at most half of longitudinal dimension of the second side of the first panel. The electrical component sub-assembly includes at least one sensor. The at least one sensor is substantially of cylindrical shape with a flat circular end and a hemispherical end. The flat circular end of cylindrical shape of the at least one sensor is affixed on the printed circuit board with plane of the flat circular end parallel to plane of the first enclosure. The electrical component sub-assembly includes an LED. The LED is affixed on the printed circuit board such that normal to plane of the printed circuit board is orthogonal to longitudinal axis of the LED. The electrical component sub-assembly includes a push button. The push button is characterized by a cuboidal base with a circular cavity centered at geometrical center of a first face of the cuboidal base. The circular cavity receives a cylindrical section. Normal to the first face of the cuboidal base is along longitudinal direction of the cylindrical section. The circular cavity of the cuboidal base enables to and fro motion of the cylindrical section in direction parallel to plane of the first panel. A second face succeeding the first face of the cuboidal base is affixed on the printed circuit board such that the second face is parallel to plane of the first panel. The electrical component sub-assembly includes a pair of AA batteries. A first end face of each battery of the pair of AA batteries is affixed on the first side of the printed circuit board such that normal to plane of the printed circuit board is orthogonal to longitudinal direction of the pair of AA batteries. Physical measurements of the home security device assembly comply with requirements of direct mail package. The home security device assembly is characterized by a length, a width, a depth and a weight.

In an embodiment of the present disclosure, the home security device assembly includes an adhesive mounting stripe. The adhesive mounting stripe is characterized by rectangular shape. The adhesive mounting stripe includes a first face and a second face. The first face of the adhesive mounting stripe is affixed on the second panel. The second face of the adhesive mounting strip includes one or more adhesives for affixing the home security device assembly against various surfaces.

In an embodiment of the present disclosure, the substantially cuboidal housing is characterized by filleted sides and filleted edges.

In an embodiment of the present disclosure, the second panel includes a through hole. The through hole corresponds to cylindrical shaped cavity. The through hole is at geometrical center of the second panel.

In an embodiment of the present disclosure, the ledge of the first enclosure is characterized by filleted sides and filleted edges. The continuous ledge is characterized by filleted sides and filleted edges.

In an embodiment of the present disclosure, the first panel includes at least one male slide locking section. The second panel includes at least one female slide locking section. The at least one male slide locking section of the first panel is corresponding to the at least one female slide locking section of the second panel. The at least one male slide locking section of the first panel engages and locks with the at least one female slide locking section.

In an embodiment of the present disclosure, the home security device assembly pairs directly with a plurality of devices without requiring a hub The plurality of devices include Wi-Fi enabled devices, Bluetooth enabled devices and a plurality of communication devices.

In an embodiment of the present disclosure, the length of the home security device assembly is 9±0.5 centimeters.

In an embodiment of the present disclosure, the width of the home security device assembly is 3.9±0.5 centimeters.

In an embodiment of the present disclosure, the height of the home security device assembly is 1.8±0.5 centimeters.

In an embodiment of the present disclosure, the weight of the home security device assembly is 67.2±1.0 gram.

In an embodiment of the present disclosure, a second section of the electrical component sub-assembly is outside the substantially cuboidal housing.

In an embodiment of the present disclosure, the LED is characterized by a flat circular base with hemispherical top. The longitudinal axis of the LED corresponds to imaginary axis passing through geometrical center of the flat circular base and orthogonally to plane of the flat circular base.

In an embodiment of the present disclosure, the pair of AA batteries includes a first AA battery and a second AA battery. Longitudinal direction of the first AA battery is parallel to longitudinal direction of the second AA battery. The first AA battery is opposite in orientation with respect to the second AA battery.

In an embodiment of the present disclosure, a second end face of each battery of the pair of AA batteries is electrically connected with facilitation of a rectangular conductor plate.

In an embodiment of the present disclosure, extension length of the ledge of the first panel and the continuous ledge of the second panel is identical.

In an embodiment of the present disclosure, the at least one sensor is selected from a group. The group includes motion sensor, glass break sensor, door open/close sensor, window open close sensor and tamper detection sensor.

In an embodiment of the present disclosure, the electrical component sub-assembly includes a wireless communication module.

BRIEF DESCRIPTION OF FIGURES

Having thus described the disclosure, in general, terms, reference will now be made to the accompanying figures, wherein:

It should be noted that the accompanying figures are intended to present illustrations of exemplary embodiments of the present disclosure. These figures are not intended to limit the scope of the present disclosure. It should also be noted that accompanying figures are not necessarily drawn to scale.

DETAILED DESCRIPTION

In the following description, for purposes of explanation, numerous specific details are set forth in order to provide a thorough understanding of the present technology. It will be apparent, however, to one skilled in the art that the present technology can be practiced without these specific details. In other instances, structures and devices are shown in block diagram form only in order to avoid obscuring the present technology.

Reference in this specification to "one embodiment" or "an embodiment" means that a particular feature, structure, or characteristic described in connection with the embodiment is included in at least one embodiment of the present technology. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present technology. Similarly, although many of the features of the present technology are described in terms of each other, or in conjunction with each other, one skilled in the art will appreciate that many of these features can be provided independently of other features. Accordingly, this description of the present technology is set forth without any loss of generality to, and without imposing limitations upon, the present technology.

Figure 1:
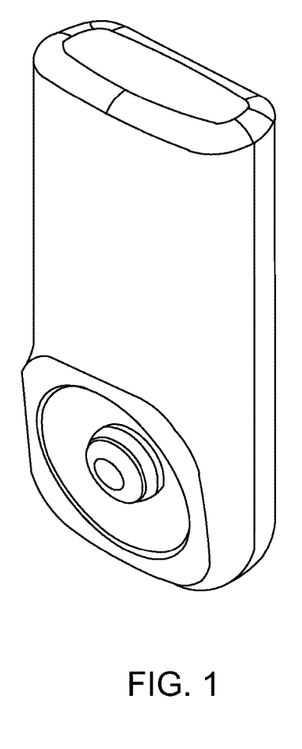
FIG. 1 illustrates a cross sectional view of a home security device assembly, in accordance with various embodiment of the present disclosure.

FIG. 1 illustrates a cross sectional view of a home security device assembly 100, in accordance with various embodiments of the present disclosure. In general, a home security device is a device for monitoring, intrusion detection and surveillance of a facility. The home security device assembly 100 includes a plurality of electrical components and a protective housing. The protective housing of the home security device assembly 100 encapsulates the plurality of electrical components. The protective housing provides mechanical support to the plurality of electrical components. The protective housing isolates the plurality of electrical components from dust, dirt moisture and other foreign elements. The protective housing facilitates to install the home security device assembly 100 on a surface. The protective housing includes one or more provisions for affixing the home security device assembly 100 against the surface.

The home security device assembly 100 is configured to pair directly with a plurality of devices without requiring a hub. In general, hub corresponds to a common connection point for devices in a network. The home security device assembly 100 is equipped with wireless communication means to communicate with various wireless communication devices. The plurality of devices includes Wi-Fi enabled devices, Bluetooth enabled devices and a plurality of communication devices. The home security device assembly 100 pairs directly with home Wi-Fi network of user. The home security device assembly 100 does not require additional means for connecting with home Wi-Fi, Bluetooth device or communication device. The plurality of communication devices includes smartphones, tablets, laptops and the like. In an embodiment of the present disclosure, the home security device assembly 100 connects with any suitable wireless device of the like.

The home security device assembly 100 includes the plurality of electrical components. The plurality of electrical components enables monitoring, intrusion detection and surveillance of the facility. The plurality of electrical components includes power storage devices. The power storage device provides electrical power to various electrical components of the home security device assembly 100. The plurality of electrical components includes sensors. The sensors enable plurality of security features for monitoring of the facility by the home security device assembly 100. The plurality of electrical components includes one or more buttons. The one or more buttons facilitate in operating and customizing features of the hone security device assembly 100. The one or more buttons facilitates to operate the home security device assembly 100 according to requirements of users. The plurality of electrical components includes various other electrical components.

The home security device assembly 100 is designed in such a way in order to be enabled for mailing by direct mail packaging service. The home security device assembly 100 is distributed by direct mail marketing program. In general, direct mail marketing corresponds to marketing product mailed directly to homes of consumers or offices of business buyers. For examples, postcards with an offer, catalogs that display goods, coupons, solicitation letters from nonprofits and free samples sent by businesses. The home security device assembly 100 is suitable for mailing by direct mail package. Physical dimensions of the home security device assembly 100 comply with various requirements of direct mail package. The home security device assembly 100 is compact in size and light in weight. The compact size and light weight enables the home security device assembly 100 to be dispatched by direct mail packages.

The physical measurements of the home security device assembly 100 comply with requirements of direct mail package. The physical measurements of the home security device assembly 100 comply with weight and form factor requirements of direct mail program. The physical measurements of the home security device assembly 100 comply with length, width and height requirements of direct mail program. The home security device assembly 100 is characterized by a length, a width, a depth and a weight. The length of the home security device assembly 100 is in a range of 9±0.5 centimeters. In an embodiment of the present disclosure, the home security device assembly 100 has any suitable length. The width of the home security device assembly 100 is in a range of 3.9±0.5 centimeters. In an embodiment of the present disclosure, the home security device assembly 100 has any suitable width. The height of the home security device assembly 100 is in a range of 1.8±0.5 centimeters. In an embodiment of the present disclosure, the home security device assembly 100 has any suitable height. The weight of the home security device assembly 100 is in a range of 67.2±1.0 grams. In an embodiment of the present disclosure, the home security device assembly 100 has any suitable weight. The home security device assembly 100 includes a first panel 200, a second panel 300 and an electrical component sub-assembly 400. In an embodiment of the present disclosure, the home security device assembly 100 includes any suitable components.

Figure 2:
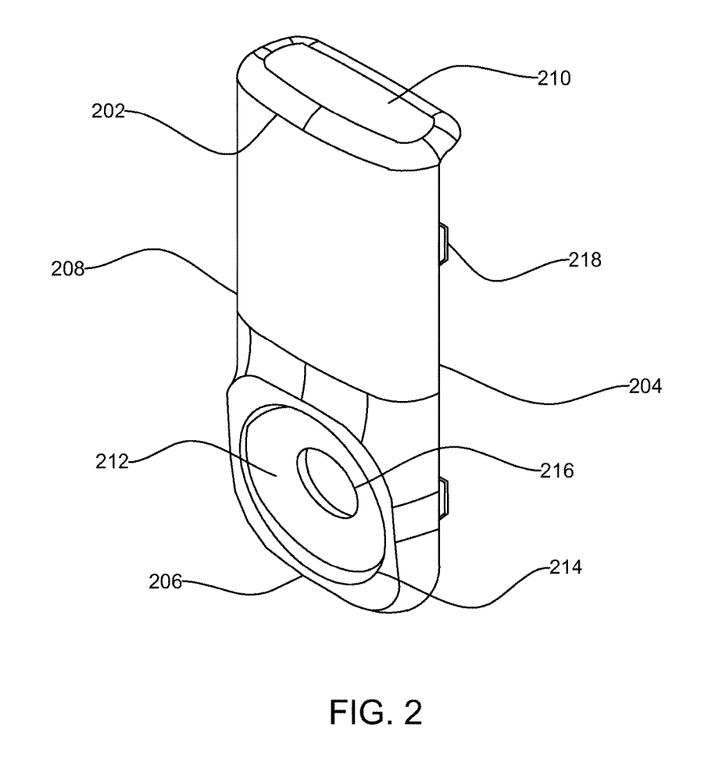
FIG. 2 illustrates a cross sectional view of a first panel of the home security device, in accordance with an embodiment of the present disclosure.

FIG. 2 illustrates a cross sectional view of the first panel 200, in accordance with an embodiment of the present disclosure. It may be noted that to explain the elements of FIG. 2, references will be made to the elements of FIG. 1. The first panel 200 is front cover of the home security device assembly 100. The first panel 200 is front cover of the protective housing of the home security device assembly 100. The first panel 200 is characterized by rectangular shape. The first panel 200 is substantially rectangular in cross-section. In an embodiment of the present disclosure, the first panel 200 is of any suitable shape of the like. The first panel 200 includes a first side 202, a second side 204, a third side 206 and a fourth side 208.

The first panel 200 includes a ledge 210. The ledge 210 extends from the first side 202 of the first panel 200. The ledge 210 extends from entire length of the first side 202. The ledge 210 is substantially rectangular in cross section. In an embodiment of the present disclosure, the ledge 210 is of any suitable cross section of the like. The ledge 210 extends such that, plane of the ledge 210 is orthogonal to plane of the first panel 200. The ledge 210 extends up-to a first length from the first panel 200. The first length is measured in direction orthogonal to plane of the first panel 200. In an embodiment of the present disclosure, the ledge 210 extends up-to any suitable length from the first panel 200. The ledge 210 is characterized by filleted sides and edges. The ledge 210 includes filleted sides and filleted edges.

The first panel 200 includes a hollow circular tapered intrusion 212. The hollow circular tapered intrusion 212 corresponds to a tapered surface intrusion with circular cavity at its base. The hollow circular tapered intrusion 212 is characterized by a first circular base 214 and a second circular base 216. The first circular base 214 is initial surface of intrusion of the hollow circular tapered intrusion 212. The second circular base 216 is final surface of intrusion of the hollow circular tapered intrusion 212. The first circular base 214 is characterized by a first radius. The first radius is radius of circular cross-section of the first circular base 214. The second circular base 216 is characterized by a second radius. The second radius is radius of circular cross-section of the second circular base 216.

Radius of the first circular base 214 is greater than radius of the second circular base 216. The first radius of the first circular base 214 is greater than the second radius of the second circular base 216. In an embodiment of the present disclosure, the first circular base 214 and the second circular base 216 have any suitable radius. The first circular base 214 is coplanar with plane of the first panel 200. The first circular base 214 is at least in a single point contact with a plurality of sides of the first panel 200. The plurality of sides of the first panel includes the second side 204, the third side 206 and the fourth side 208. In an embodiment of the present disclosure, the first circular base 214 is in contact with any suitable side of the first panel 200.

The second circular base 216 is offset from plane of the first panel 200. Imaginary plane of the second circular base 216 is offset from plane of the first panel 200. In an embodiment of the present disclosure, the second circular base is coplanar with plane of the first panel 200. Direction of intrusion of the hollow circular tapered intrusion 212 and direction of extension of plane of the ledge 210 are identical. Direction of intrusion of the hollow circular tapered intrusion 212 and direction of extension of plane of the ledge 210 are parallel. In an embodiment of the present disclosure, the hollow circular tapered intrusion 212 intrudes in any suitable direction of the like. In an embodiment of the present disclosure, the ledge 210 extends in any suitable direction of the like.

Further, the first panel 200 includes at least one male slide locking section 218. The at least one male slide locking section 218 is designed to engage with corresponding female slide locking section. The at least one male slide locking section 218 corresponds to one or more protrusions extending from the first panel 200. The one or more protrusions of the male slide locking section 218 engage with corresponding one or more intrusions of female slide lock. In an embodiment of the present disclosure, the first panel 200 includes any suitable attachment to enable a locking mechanism. In another embodiment of the present disclosure, the first panel 200 includes any suitable locking mechanism of the like.

Figure 3:
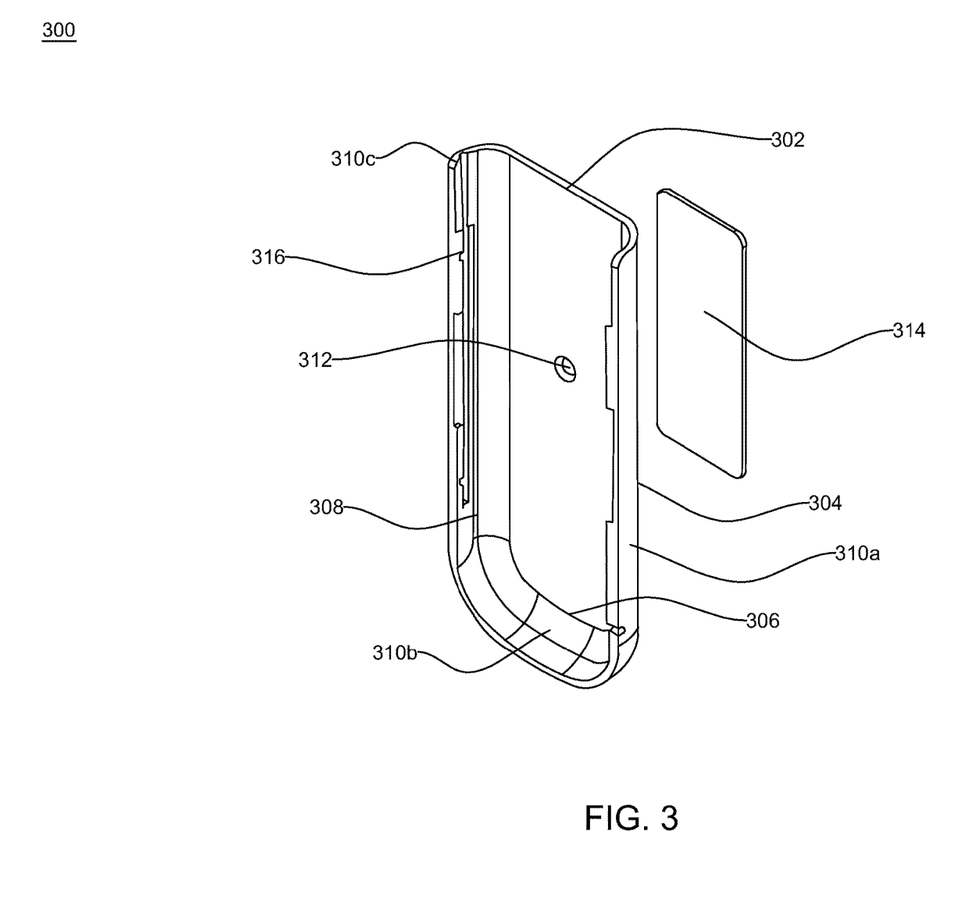
FIG. 3 illustrates a cross sectional view of a second panel of the home security device, in accordance with an embodiment of the present disclosure.

FIG. 3 illustrates a cross sectional view of the second panel 300, in accordance with various embodiment of the present disclosure. It may be noted that to explain the elements of FIG. 3, references will be made to the elements of FIG. 1 and FIG. 2. The second panel 300 is rear cover of the home security device assembly 100. The second panel 200 is rear cover of the protective housing of the home security device assembly 100. The second panel 200 is characterized by rectangular shape. Dimensions of rectangular shape of the second panel 300 are identical to corresponding dimensions of rectangular shape of the first panel 200. In an embodiment of the present disclosure, the second panel 300 is of any suitable shape of the like.

The second panel 300 includes a first side 302, a second side 304, a third side 306, and a fourth side 308. The second panel 300 includes a continuous ledge 310a-c extending from three sides of the second panel 300. The continuous ledge 310a-c corresponds to a single ledge extending from entire length of the three different sides of the second panel 300. The three sides of the second panel 300 are the second side 304, the third side 306 and the fourth side 308. The continuous ledge 310a-c includes a first extended section 310a, a second extended section 310b, and a third extended section 310c. The first extended section 310a extends from the second side 304. The second extended section 310b extends from the third side 306. The third extended section 310c extends from the fourth side 308. The first extended section 310a, the second extended section 310b, and the third extended section 310c collectively enable the continuous ledge 310a-c. In an embodiment of the present disclosure, each of the extended section extends from any suitable sides.

Plane of each of the continuous ledge 310a-c is orthogonal to plane of the second panel 300. Plane of the first extended section 310a is orthogonal to plane of the second panel 300. Plane of the second extended section 310b is orthogonal to plane of the second panel 300. Plane of the third extended section 310c is orthogonal to plane of the second panel 300. The continuous ledge 310a-c is characterized by filleted sides and edges. The first extended section 310a includes filleted sides and filleted edges. The second extended section 310b includes filleted sides and filleted edges. The third extended section 310c includes filleted sides and filleted edges. The second panel 300 includes a first face and a second face. The first face and the second face correspond to two opposite faces of rectangular shape of the second panel 300. The first face of the second panel 300 is toward the direction of extension of the continuous ledge 310a-c. The second face of the second panel 300 is opposite the direction of extension of the continuous ledge 310a-c. Extension length of the ledge 210 of the first panel 200 and the continuous ledge 310a-c of the second panel 300 is identical. The ledge 210 and the continuous ledge 310a-c are extended up to identical length.

Further, the second panel 300 includes a through hole 312. The through hole 312 is characterized by a central axis. The central axis of the through hole 312 is orthogonal to plane of the second panel 300. The through hole 312 corresponds to cylindrical shaped cavity. The through hole 312 is at geometrical center of the second panel 300. The through hole 312 is a countersunk screw hole. The through hole 312 provides a recess for inserting a screw or any suitable fastening means of the like. The through hole 312 is utilized to affix the home security device assembly 100 against any surface with facilitation of screw.

In addition, the home security device assembly 100 includes an adhesive mounting stripe 314 (as shown in FIG. 3). The adhesive mounting stripe 314 facilitates to affix the home security device assembly 100 on a variety of surfaces. The adhesive mounting stripe 314 is characterized by rectangular shape. The adhesive mounting stripe includes a first face and a second face. The first face and the second face are the opposite rectangular faces of the adhesive mounting stripe 314. The first face of the adhesive mounting stripe 314 is affixed on the second panel 300. The first face of the adhesive mounting stripe 314 is affixed on the second face of the second panel 300. The second face of the adhesive mounting strip 314 includes one or more adhesives. In general, adhesive corresponds to a substance used for sticking objects or materials together. The one or more adhesives facilitate to affix the home security device assembly 100 against various surfaces. In an embodiment of the present disclosure, the home security device assembly 100 includes any suitable means for affixing on various surfaces.

In addition, the second panel 300 includes at least one female slide locking section 316. The at least one female slide locking section 316 of the second panel 300 is designed to engage with the at least one male slide locking section 218 of the first panel 200. The at least one female slide locking section 316 corresponds to one or more intrusions into the second panel 300. The at least one male slide locking section 218 and the at least one female slide locking section 316 collectively enable a slide lock for the housing of the home security device assembly 100. The at least one male slide locking section 218 engages and locks with the at least one female slide locking section 316. In an embodiment of the present disclosure, the first panel 200 and the second panel 300 includes any suitable locking mechanism.

Further, the first panel 200 and the second panel 300 snap fittingly engage to enable a substantially cuboidal housing for the home security device assembly 100. The substantially housing of the home security device assembly 100 is formed of the first panel 200 and the second panel 300. The substantially cuboidal housing of the home security device assembly 100 includes the first panel 200, the ledge 210, the second panel 300 and the continuous ledge 310a-c. Six faces of the substantially cuboidal housing of the home security device assembly 100 are formed of the first panel 200, the ledge 210, the first extended section 310a, the second extended section 310b, the third extended section 310c and the second panel 300. The substantial cuboidal housing of the home security device assembly 100 is characterized by filleted sides and filleted edges. The substantial cuboidal housing of the home security device assembly 100 includes filleted sides. The substantial cuboidal housing of the home security device assembly 100 includes filleted edges.

Figure 4:
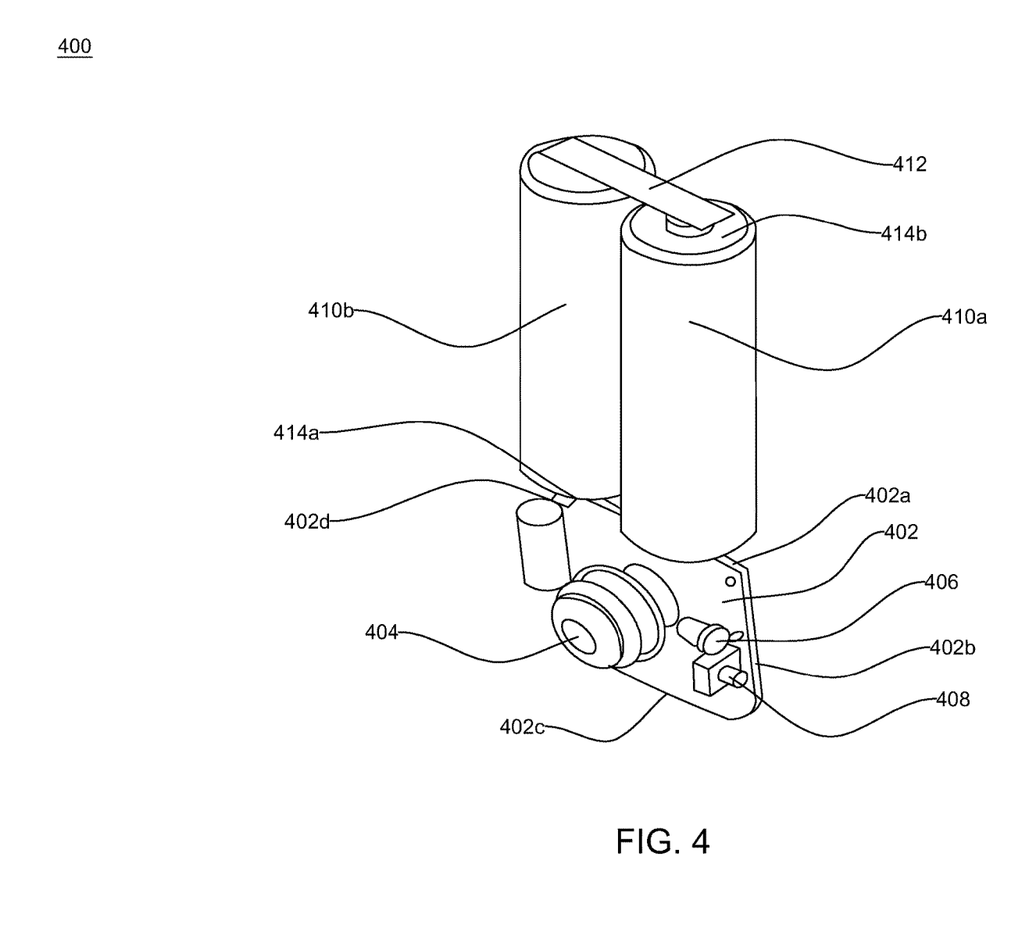
FIG. 4 illustrates a cross sectional view of an electrical component sub-assembly of the home security device, in accordance with an embodiment of the present disclosure.

FIG. 4 illustrates a cross sectional view of the electrical component sub-assembly 400, in accordance with various embodiment of the present disclosure. It may be noted that to explain the elements of FIG. 4, references will be made to the elements of FIG. 1, FIG. 2 and FIG. 3. The electrical component sub-assembly 400 corresponds to plurality of electrical components of the home security device assembly 100. The plurality of electrical components enables monitoring, intrusion detection and surveillance of the facility. The electrical component sub assembly includes a first section and a second section. The first section is major section of the electrical component sub-assembly 400. The second section is minor section of the electrical component sub-assembly 400. The substantially cuboidal housing encapsulates the first section of the electrical component sub-assembly 400. The electrical component sub-assembly 400 includes a printed circuit board 402, at least one sensor 404, an LED 406, a push button 408, a pair of AA batteries 410a-b and a rectangular conductor plate 412. In an embodiment of the present disclosure, the electrical component sub-assembly 400 includes any suitable component of the like.

The electrical component sub-assembly 400 includes the printed circuit board 402. In general, printed circuit board mechanically supports and electrically connects electronic components or electrical components using conductive tracks, pads and other features etched from one or more sheet layers of copper laminated onto and/or between sheet layers of a non-conductive substrate. The printed circuit board 402 is installed with plane of the printed circuit board 402 arranged parallel to plane of the first panel 200. The printed circuit board 402 is installed with plane of the printed circuit board 402 arranged parallel to plane of the second panel 300. The printed circuit board 402 is characterized by a rectangular shape. The printed circuit board 402 includes a first side 402a, a second side 402b, a third side 402c and a fourth side 402d. Longitudinal dimension of the second side 402b of the printed circuit board 402 is at most half of longitudinal dimension of the second side 204 of the first panel 200. In an embodiment of the present disclosure, the printed circuit board 402 is of any suitable shape. In an embodiment of the present disclosure, the printed circuit board 402 is of any suitable size.

The electrical component sub-assembly 400 includes the at least one sensor 404. The at least one sensor 404 enables security features of the home security device assembly 100. The security features of the home security device 100 assembly include monitoring, intrusion detection and surveillance of the facility. The at least one sensor 404 is substantially of cylindrical shape. In general, cylindrical shape includes two ends. The two ends correspond to a first circular end section of cylindrical shape and a second circular end section of cylindrical shape. The cylindrical shape of the at least one sensor 404 includes a flat circular end and a hemispherical end. The flat circular end of cylindrical shape of the at least one sensor 404 is affixed on the printed circuit board 402. The at least one sensor 404 is affixed on the printed circuit board 402 with plane of the flat circular end is parallel to plane of the first enclosure 200. The flat circular end of the at least one sensor 404 is affixed on the printed circuit board 402. In an embodiment of the present disclosure, the at least one sensor is of any suitable shape of the like.

The at least one sensor 404 for the home security device assembly 100 is selected from a group. The group includes motion sensor, glass break sensor, door open/close sensor, window open close sensor, object detection sensor and tamper detection sensor. In an embodiment of the present disclosure, the group includes contact sensors, magnetic sensors, optical sensors, photo beam alarms, environment sensors, passive infrared sensor and microwave sensor. In another embodiment of the present disclosure, the group includes any suitable sensor of the like. In an embodiment of the present disclosure, the home security device assembly 100 includes a plurality of sensors.

The electrical component sub-assembly includes the LED 406. In general, light-emitting diode or LED is a two-lead semiconductor light source that emits light on activation by a suitable current pulse. The LED 406 indicates current status of the home security device assembly 100. The LED 406 illuminates a plurality of colors. The LED 406 illuminates one color of the plurality of color at a particular time. Each of the plurality of color corresponds to a status of the home security device assembly 100. The status of the home security device assembly 100 includes active, non-active, battery low, electrical fault, wireless connection fault, undefined fault. In embodiment of the present disclosure, the status of the home security device assembly 100 includes any suitable status of the like.

The LED 406 is characterized by a flat circular base with hemispherical top. Longitudinal axis of the LED 406 corresponds to imaginary axis passing through geometrical center of the flat circular base and orthogonally to plane of the flat circular base. The LED 406 is affixed on the printed circuit board 402 such that normal to plane of the printed circuit board 402 is orthogonal to longitudinal axis of the LED 406. In an embodiment of the present disclosure, the LED 406 is affixed on the printed circuit board 402 in any suitable orientation of the like.

Further, the electrical component sub-assembly 400 includes the push button 408. The push button 408 acts as switch for switching ON and switching OFF the home security device assembly 100. In addition, the push button 408 facilitates to rest the home security device assembly 100. In an embodiment of the present disclosure, the push button 408 is utilized in any suitable manner of the like. The push button 408 is characterized by a cuboidal base. The cuboidal base includes a first face, a second face, a third face, a fourth face, a fifth face and a sixth face. The cuboidal base includes a circular cavity centered at geometrical center of a first face of the cuboidal base. The circular cavity provides space for to and fro motion of a body relative to the cuboidal base.

The circular cavity receives a cylindrical section. The cylindrical section corresponds to section of the push button 408 pressed by users. The cylindrical section of the push button 408 is pressed for operating the home security device assembly 100. Normal to the first face of the cuboidal base is along longitudinal direction of the cylindrical section. The circular cavity of the cuboidal base enables to and fro motion of the cylindrical section in direction parallel to plane of the first panel 200. The second face succeeding the first face of the cuboidal base is affixed on the printed circuit board 402. The second face is affixed on the printed circuit board 402 such that plane of the second face is parallel to plane of the first panel 200.

The electrical component sub-assembly 400 includes the pair of AA batteries 410a-b. In general, a battery is an electrochemical cell that can be charged electrically to provide a static potential or released electrical charge according to requirement. The pair of AA batteries 410a-b stores electrical energy. The pair of AA batteries 410a-b provides electrical power for functioning of various electrical components of the electrical components sub-assembly

400. The pair of AA batteries 410*a-b* provides electrical power for operating electrical components of the home security device assembly 100. The pair of AA batteries 410*a-b* includes two AA batteries. Each AA battery of the pair of AA batteries 410*a-b* is of cylindrical shape. Cylindrical shape of each battery of the pair of AA batteries 410*a-b* is characterized by a longitudinal axis. The longitudinal axis is an imaginary central axis along length of cylindrical shape and orthogonal to both circular end of cylindrical shape. Each battery of the pair of AA batteries 410*a-b* are arranged such that longitudinal axis of one battery parallel to longitudinal axis of other battery.

The pair of AA batteries 410*a-b* includes a first AA battery 410*a* and a second AA battery 410*b*. Longitudinal direction of the first AA battery 410*a* is parallel to longitudinal direction of the second AA battery 410*b*. The first AA battery 410*a* is arranged opposite in orientation with respect to the second AA battery 410*b*. The pair of AA batteries 410*a-b* includes a first end face 414*a* and a second end face 414*b*. The first end face 414*a* corresponds to one circular end of cylindrical shape of the two batteries of the pair of AA batteries 410*a-b*. The second end face 414*b* corresponds to another circular end of cylindrical shape of the two batteries of the pair of AA batteries 410*a-b*. The first end face 414*a* of each battery of the pair of AA batteries is affixed on the first side 402*a* of the printed circuit board 402 such that normal to plane of the printed circuit board 402 is orthogonal to longitudinal direction of the pair of AA batteries 410*a-b*.

The pair of AA batteries 410*a-b* is affixed on the first side 402*a* of the printed circuit board 402. In an embodiment of the present disclosure, the pair of AA batteries 410*a-b* is affixed in any suitable orientation of the printed circuit board 402. The second end face of each battery of the pair of AA batteries 410*a-b* is electrically connected with facilitation of a rectangular conductor plate 412. The second end face of the first AA battery 410*a* is electrically connected with the second AA battery 410*b* with facilitation of the rectangular plate 412. The rectangular conductor plate 412 completes electrical circuit between the first AA battery 410*a* and the second AA battery 410*b*. The electrical component sub-assembly 400 includes two battery springs. Each battery springs facilitates to establish electrical connection with a battery of the pair of AA batteries 410*a-b*. In general, battery springs are pressed against battery terminals to make electrical connection with batteries in an electrical circuit. In an embodiment of the present disclosure, the electrical component sub-assembly includes any suitable number of battery springs.

The electrical component sub-assembly 400 includes a wireless communication module. The wireless communication module enables the home security device assembly 100 to communicate with a remote server or communication device. The wireless communication module enables the home security device assembly 100 to transmit signals or data to plurality of wireless communication devices. The wireless communication module enables the home security device assembly 100 to receive signals or data from plurality of wireless communication devices. The wireless communication module of the home security device assembly 100 pairs easily and quickly with various communication devices of users. The wireless communication module enables the home security device assembly 100 to broadcast one or more signals to communication devices of users. The one or more signals are broadcasted to communication devices of users in one or more emergency situations.

The electrical component sub-assembly 400 further includes a first section and a second section. The substantially cuboidal housing of the home security device assembly 100 encapsulates the first section of the electrical component sub-assembly 400. The second section of the electrical component sub-assembly 400 is outside the substantially cuboidal housing of the home security device assembly 100. The second section of the electrical component sub-assembly 400 includes the hemispherical end of cylindrical shape of the at least one sensor 404. The hemispherical end of cylindrical shape of the at least one sensor 404 is protruding out of circular cavity of the substantially cuboidal housing of the home security device assembly 100. The hemispherical end of cylindrical shape of the at least one sensor 404 of the electrical component sub-assembly 400 is not enclosed by the substantially cuboidal housing.

The first section of the electrical component sub-assembly 400 includes remaining electrical components of the electrical component sub-assembly 400 not included in the second section. The first section of the electrical component sub-assembly 400 includes electrical components remaining after removing the hemispherical end of cylindrical shape of the at least one sensor 404 of the electrical component sub-assembly 400. The first section of the electrical component sub-assembly 400 includes every components of the electrical component sub-assembly except hemispherical end of cylindrical shape of the at least one sensor 404.

Figure 5:
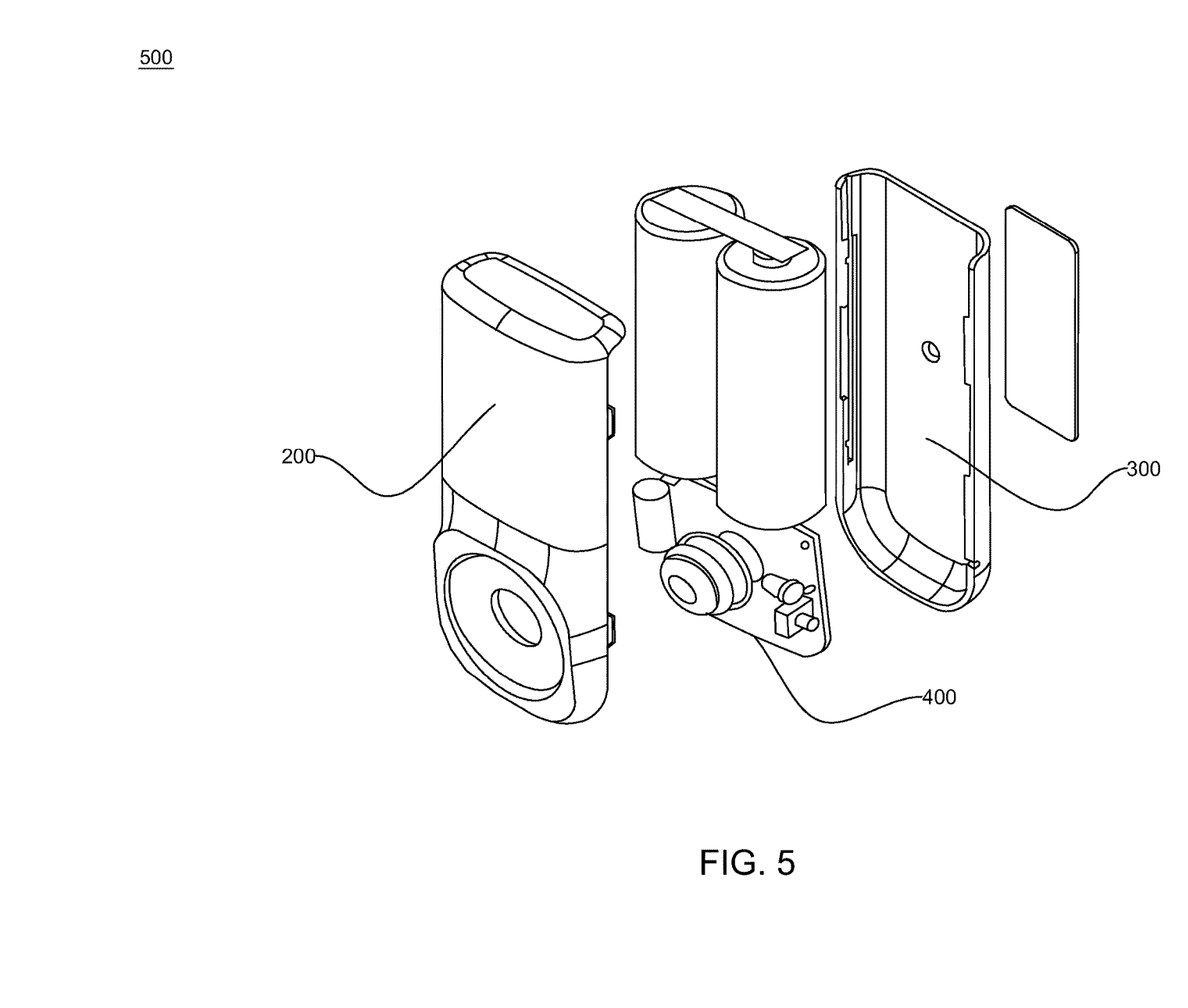
FIG. 5 illustrates a cross sectional view of exploded home security device assembly, in accordance with an embodiment of the present disclosure.

FIG. 5 illustrates a cross sectional view of exploded home security device assembly 500, in accordance with various embodiment of the present disclosure. It may be noted that to explain the elements of FIG. 5, references will be made to the elements of FIG. 1, FIG. 2, FIG. 3 and FIG. 4. The exploded home security device assembly 500 includes the first panel 200, the second panel 300 and the electrical component sub-assembly 400. The exploded home security device assembly 500 illustrates orientation and position of various components in the home security device assembly 100. The exploded home security device assembly 500 illustrates internal component arrangement of the home security device assembly 100. The exploded home security device assembly 500 illustrates orientation and position of the first panel 200 and the second panel 300 to enable the substantially cuboidal housing for the electrical component sub-assembly 400.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is understood that various omissions and substitutions of equivalents are contemplated as circumstance may suggest or render expedient, but such are intended to cover the application or implementation without departing from the spirit or scope of the claims of the present technology.

While several possible embodiments of the invention have been described above and illustrated in some cases, it should be interpreted and understood as to have been presented only by way of illustration and example, but not by limitation. Thus, the breadth and scope of a preferred embodiment should not be limited by any of the above-described exemplary embodiments.

We claim:

1. A home security device assembly for mailing by direct mail package, the home security device assembly comprising:
 a first panel, wherein the first panel is characterized by a rectangular shape, wherein the first panel having a ledge extending from a first side of the first panel, wherein plane of the ledge is orthogonal to plane of the first panel, wherein the first panel having a hollow circular tapered intrusion, wherein the hollow circular tapered intrusion is characterized by a first circular base and a second circular base, wherein radius of the first circular base is greater than radius of the second circular base, wherein the first circular base is coplanar with plane of the first panel, wherein the first circular base is at least in a single point contact with each of a second side of the first panel, a third side of the first panel and a fourth side of the first panel, wherein the second circular base is offset from plane of the first panel, wherein direction of intrusion of the hollow circular tapered intrusion and direction of extension of plane of the ledge are identical and parallel;
 a second panel, wherein the second panel is characterized by rectangular shape, wherein dimensions of the rectangular shape of the second panel is identical to corresponding dimensions of the rectangular shape of the first panel, wherein the second panel having a first side, a second side, a third side and a fourth side, wherein the second panel having a continuous ledge extending from three sides of the second panel, wherein the three sides of the second panel are the second side, the third side and the fourth side, wherein the continuous ledge having a first extended section, a second extended section and a third extended section, wherein plane of each extended section of the continuous ledge is orthogonal to plane of the second panel, wherein the first panel and the second panel snap fittingly engage to enable a substantially cuboidal housing for the home security device assembly;
 an electrical components sub-assembly, wherein the substantially cuboidal housing encapsulates a first section of the electrical components sub-assembly, wherein the electrical components sub-assembly comprising:
  a printed circuit board, wherein plane of the printed circuit board is parallel to plane of the first panel and the second panel, wherein the printed circuit board comprising a first side, a second side, a third side and a fourth side, wherein longitudinal dimension of the second side of the printed circuit board is at most half of longitudinal dimension of the second side of the first panel;
  at least one sensor, wherein the at least one sensor is substantially of cylindrical shape with a flat circular end and a hemispherical end, wherein the flat circular end of the cylindrical shape of the at least one sensor is affixed on the printed circuit board with plane of the flat circular end parallel to plane of the first panel;
  an LED, wherein the LED is affixed on the printed circuit board such that normal to plane of the printed circuit board is orthogonal to a longitudinal axis of the LED;
  a push button, wherein the push button is characterized by a cuboidal base with a circular cavity centered at geometrical center of a first face of the cuboidal base, wherein the circular cavity receiving a cylindrical section, wherein normal to the first face of the cuboidal base is along longitudinal direction of the cylindrical section, wherein the circular cavity of the cuboidal base enables to and from motion of the cylindrical section in direction parallel to plane of the first panel, wherein a second face succeeding the first face of the cuboidal base is affixed on the printed circuit board such that the second face is parallel to plane of the first panel; and
  a pair of AA batteries, wherein a first end face of each battery of the pair of AA batteries is affixed on the first side of the printed circuit board such that normal to plane of the printed circuit board is orthogonal to longitudinal direction of the pair of AA batteries,
   wherein physical measurements of the home security device assembly comply with requirements of direct mail package, wherein the home security device assembly is characterized by a length, a width, a depth and a weight.

2. The home security device assembly as recited in claim 1, further comprising an adhesive mounting stripe, wherein the adhesive mounting stripe is characterized by rectangular shape, wherein the adhesive mounting stripe having a first face and a second face, wherein the first face of the adhesive mounting stripe is affixed on the second panel, wherein the second face of the adhesive mounting strip having one or more adhesives for affixing the home security device assembly against various surfaces.

3. The home security device assembly as recited in claim 1, wherein the substantially cuboidal housing is characterized by filleted sides and filleted edges.

4. The home security device assembly as recited in claim 1, wherein the second panel having a through hole, wherein the through hole corresponds to cylindrical shaped cavity, wherein the through hole is at geometrical center of the second panel.

5. The home security device assembly as recited in claim 1, wherein the ledge of the first panel is characterized by filleted sides and filleted edges, wherein the continuous ledge is characterized by filleted sides and filleted edges.

6. The home security device assembly as recited in claim 1, wherein the first panel having at least one male slide locking section, wherein the second panel having at least one female slide locking section, wherein the at least one male slide locking section of the first panel is corresponding to the at least one female slide locking section of the second panel, wherein the at least one male slide locking section of the first panel engages and locks with the at least one female slide locking section.

7. The home security device assembly as recited in claim 1, wherein the home security device assembly pairs directly with a plurality of devices without requiring a hub, wherein the plurality of devices comprising Wi-Fi enabled devices, Bluetooth enabled devices and a plurality of communication devices.

8. The home security device assembly as recited in claim 1, wherein the length of the home security device assembly is 9±0.5 centimeters.

9. The home security device assembly as recited in claim 1, wherein the width of the home security device assembly is 3.9±0.5 centimeters.

10. The home security device assembly as recited in claim 1, wherein the height of the home security device assembly is 1.8±0.5 centimeters.

11. The home security device assembly as recited in claim 1, wherein the weight of the home security device assembly is 67.2±1.0 gram.

12. The home security device assembly as recited in claim 1, wherein a second section of the electrical component sub-assembly is outside the substantially cuboidal housing.

13. The home security device assembly as recited in claim 1, wherein the LED is characterized by a flat circular base with hemispherical top, wherein longitudinal axis of the LED corresponds to imaginary axis passing through geometrical center of the flat circular base and orthogonally to plane of the flat circular base.

14. The home security device assembly as recited in claim 1, wherein the pair of AA batteries having a first AA battery and a second AA battery, wherein longitudinal direction of the first AA battery is parallel to longitudinal direction of the second AA battery, wherein the first AA battery is opposite in orientation with respect to the second AA battery.

15. The home security device assembly as recited in claim 1, wherein a second end face of each battery of the pair of AA batteries is electrically connected with facilitation of a rectangular conductor plate.

16. The home security device assembly as recited in claim 1, wherein extension length of the ledge of the first panel and the continuous ledge of the second panel is identical.

17. The home security device assembly as recited in claim 1, wherein the at least one sensor is selected from a group, wherein the group comprising motion sensor, glass break sensor, door open/close sensor, window open close sensor and tamper detection sensor.

18. The home security device assembly as recited in claim 1, wherein the electrical component sub-assembly comprising a wireless communication module.

\* \* \* \* \*